(12) United States Patent
Mednikov (10) Patent No.: US 8,476,896 B2
(45) Date of Patent: Jul. 2, 2013

(54) METHOD AND SENSOR ARRANGEMENT FOR DETERMINING THE POSITION AND/OR CHANGE OF POSITION OF A MEASURED OBJECT RELATIVE TO A SENSOR

(75) Inventor: Vladislav Mednikov, Samara (RU)

(73) Assignee: Micro-Epsilon Messtechnik GmbH & Co. KG, Ortenburg (DE)

( * ) Notice: Subject to any disclaimer, the term of this patent is extended or adjusted under 35 U.S.C. 154(b) by 894 days.

(21) Appl. No.: 12/519,554

(22) PCT Filed: Dec. 21, 2007

(86) PCT No.: PCT/DE2007/002308
§ 371 (c)(1),
(2), (4) Date: Sep. 22, 2009

(87) PCT Pub. No.: WO2008/074317
PCT Pub. Date: Jun. 26, 2008

(65) Prior Publication Data
US 2010/0090688 A1 Apr. 15, 2010

(30) Foreign Application Priority Data
Dec. 21, 2006 (DE) .......................... 10 2006 061 845

(51) Int. Cl.
*G01B 7/14* (2006.01)
(52) U.S. Cl.
USPC .................. 324/207.15; 324/207.12; 324/202
(58) Field of Classification Search
USPC ............................... 324/202, 207.15, 207.12
See application file for complete search history.

(56) References Cited

U.S. PATENT DOCUMENTS

| 4,774,465 A | 9/1988 | Nilius |
| 4,926,122 A | 5/1990 | Schroeder et al. |
| 5,608,408 A | 3/1997 | Caratori et al. |
| 5,781,006 A * | 7/1998 | Beichler .................. 324/207.19 |
| 6,605,939 B1 | 8/2003 | Jansseune et al. |

(Continued)

FOREIGN PATENT DOCUMENTS

| DE | 3041041 | 5/1982 |
| DE | 3803253 | 8/1989 |
| DE | 3803293 | 8/1989 |

OTHER PUBLICATIONS

International Preliminary Report on Patentability and Written Opinion of the International Searching Authority for International Application No. PCT/DE2007/002308.

(Continued)

*Primary Examiner* — Jay Patidar
(74) *Attorney, Agent, or Firm* — Alston & Bird LLP (57) ABSTRACT

A method for determining the position and/or change of position of a measured object relative to a sensor, where the sensor preferably has a sensor coil to which an alternating current is applied, is characterized in that a magnet associated with the measured object, in a soft magnetic foil, whose permeability changes under the influence of a magnetic field on the basis of the magnetic field's field strength and which is arranged in the area of influence of the sensor, brings about a change in the permeability of the foil and in that the change in the permeability of the foil is determined from the latter's reaction to the sensor, and this is used to determine the position and/or change of position of the measured object relative to the sensor. A sensor arrangement is designed accordingly.

17 Claims, 8 Drawing Sheets

U.S. PATENT DOCUMENTS

| | | | |
|---|---|---|---|
| 6,714,004 B2 | 3/2004 | Jagiella | |
| 2002/0089326 A1* | 7/2002 | Morrison et al. | 324/207.12 |
| 2002/0163328 A1 | 11/2002 | Jagiella et al. | |
| 2002/0180434 A1* | 12/2002 | How et al. | 324/254 |
| 2005/0184725 A1 | 8/2005 | Wang | |

OTHER PUBLICATIONS

International Search Report for International Application No. PCT/DE2007/002308.

* cited by examiner

METHOD AND SENSOR ARRANGEMENT FOR DETERMINING THE POSITION AND/OR CHANGE OF POSITION OF A MEASURED OBJECT RELATIVE TO A SENSOR

BACKGROUND OF THE INVENTION

1. Field of the Invention

The invention concerns a method for determination of the position and/or position change of a measured object relative to a sensor, the sensor preferably having a sensor coil acted upon with alternating current. The invention also concerns a corresponding sensor arrangement.

2. Description of Related Art

Electromagnetic sensors are widely used in engineering. They are used, for example, to monitor the distance between a sensor and a measured object, to measure rotational or valve lift movements, to determine the position of a piston or to detect conducting objects. This incomplete list demonstrates the extensive use possibilities of this generic type of sensor.

A permanent magnet movable along a soft magnetic core is used as measured object in a path sensor known from DE 36 10 479 A1. Two oppositely exposed exciter coils and a secondary coil are wound around the core. Depending on the position of the measured object relative to the sensor, a virtual air gap is produced on one location of the soft magnetic core, which means that the voltage induced in the secondary coil changes with the position of the measured object. The voltage is proportional to the position of the measured object relative to the sensor.

A path measurement system comprising an inductive sensor, a transducer and an evaluation unit is known from EP 1 158 266 A1. According to one practical example a magnet whose position can vary relative to the sensor is used as transducer. The magnetic field of the magnet brings the soft magnetic material of the sensor into saturation. Because of this local saturation effect the inductance of measurement coil of the sensor changes, which is connected to an oscillator, whose frequency or amplitude changes are detected.

A magnetically operable path recorder with a magnetic field sensor and a magnet that can be displaced along a movement line is known from DE 203 07 652 U1. A bar of soft magnetic material is arranged parallel to the movement line from whose end the magnetic field sensor is arranged facing the end with its sensor device. The length of the bar and the width of the magnet determine the measurement range of the path recorder.

Sensors with magnetoelectric converters are used for contactless recording of a rotational movement of a rotor. Examples of this are known from U.S. Pat. No. 4,926,122 A, EP 0 729 589 B1 or DE 30 41 041 C2. In practice these converters are positioned very tightly against the measured object in order to guarantee immunity to disturbance. At these limited spacings (often on the order of 1 mm), the sensor, especially under real operating conditions, can be damaged. It is especially important in dynamic operation to achieve reliable recording of the rotational movement at relatively large base spacing.

Other sensors and proximity switches that exploit the saturation effect of soft magnetic materials of high permeability are know from DE 38 03 293 A1, DE 38 03 253 A1 or DE 36 10 479 A1. The response distance of such sensors, however, is limited. In order to achieve greater measurement ranges the evaluation circuit must have a high amplification factor. However, this leads to large temperature-related errors and high requirements on installation tolerance.

The underlying task of the invention is therefore to provide a method with which a position or position change of the measured object relative to sensor can be measured both in static and dynamic operation with high resolution. A corresponding device with the simplest possible design is also to be provided.

SUMMARY OF VARIOUS EMBODIMENTS

The aforementioned task is solved according to the invention by the features of claim 1. According to it the method according to the invention is characterized by the fact that through a magnet assigned to the measured object in a soft magnetic foil, whose permeability is changed under the influence of a magnetic field as a function of field intensity of the magnetic field and which is arranged in the range of influence of the sensor, a change in permeability of the foil is produced and that the change in permeability of the foil is determined from its feedback on the sensor and from it the position and/or position change of the measured object relative to the sensor. Determination of a position or position change is equivalent to determination of an angle, an angle change or a rotational speed measurement.

In terms of apparatus the aforementioned task is solved by the features of claim 13. According to it the sensor arrangement according to invention is characterized by the fact that in the range of influence of the sensor a foil of soft magnetic material is arranged, in which the permeability of the foil is changed under the influence of a magnetic field as a function of the field intensity of the magnetic field and that an evaluation circuit is provided, by means of which the change in permeability of the foil is determined from the feedback on the sensor and a conclusion is drawn concerning the position and/or position change of the measured object relative to the sensor. It is also mentioned here that determination of a position or position change is equivalent to determination of an angle, an angle change or rotational speed measurement.

An alternative embodiment of the sensor arrangement according to the invention, which solves the aforementioned task, is claimed with the dependent claim 25. According to it the sensor arrangement according to the invention is characterized by the fact that in the range of influence of the sensor a foil of soft magnetic material is arranged in the which the permeability of the foil is changed under the influence of a magnetic field as a function of the field intensity of the magnetic field and in which a movement of the measured object occurs essentially in directions parallel to an expansion direction of the foil and that the change in permeability of a foil [is determined] from its feedback on the sensor and from it a conclusion is drawn concerning the position and/or position change of the measured object relative to the sensor. It is also mentioned here that determination of a position or position change is equivalent to determination of an angle, an angle change or a rotational speed measurement.

It was initially recognized in the method according to the invention that a property of soft magnetic materials can be exploited for high precision position measurement. Under the influence of an external magnetic field the permeability of soft magnetic materials varies as a function of the field intensity present.

This property can be used in a sensor arrangement. For this purpose a magnet is assigned to a measured object, whose position is to be recorded relative to the sensor. Because of this magnet the magnetic field intensity in the area of the soft magnetic material increases on approach of the measured object to the sensor or on approach of the sensor to the measured object. Because of this its permeability diminishes, which has an effect on the properties of a measurement element arranged in the vicinity of the soft magnetic material and can be assigned to a value for the position of position change of the measured object via an appropriate evaluation circuit connected to the measurement element. Appropriate measurement elements include magnetic field sensors, like Hall sensors, AMR and GMR sensors, or inductive sensors, for example, coils of an inductive sensor or an eddy current sensor or any other measurement element sensitive to changes in permeability.

It was further recognized according to the invention that an improvement in sensitivity of the sensor arrangement can be achieved by the fact that the soft magnetic material is designed merely as a thin foil. The development of volume effects is therefore largely avoided so that lower field intensities are necessary for changes in permeability and they can occur over a shorter time. This has a favorable effect on the sensitivity and dynamics of the sensor arrangement. On the other hand, this means that the magnetic field of the magnetic assigned to the measuring object has an effect on the permeability of the foil over a relatively wide measurement range.

During movements between the measured object and the sensor in directions that run essentially parallel to an expansion direction of the foil, a region of higher permeability is formed in the foil, a region of reduced permeability and a transitional region between the two regions. Depending on the distance between the sensor and measured object, the transitional region can be displaced along the foil. Because of this a high influence on the measurement element is produced over a comparatively large measurement range.

A sensor arrangement configured in this way, in which the magnetic field direction of the magnet of the measured object lies along an axis of "heavier" magnetization of the foil is of particular advantage. In this case the magnetic field of the magnet possesses coupling of only a small surface at the end of the foil. It is also advantageous that the unsaturated area of the foil can be effectively utilized.

The resolution and accuracy of the sensor arrangements according to the invention are dependent on the electromagnetic and magnetic properties of the foil. Foils made of M-metal, Vitrovac or ferrite can be used, for example.

A combination of high mechanical strength and very good electromagnetic properties, which is achieved, for example, by using a foil made of nanocrystalline material, is advantageous. Very good electromagnetic properties include high magnetic permeability (for example µ=50,000-500,000), relatively low electrical conductivity and small losses over large temperature and frequency ranges.

The described effects can be exploited according to the invention by the embodiments described below. The objective of these embodiments is to devise a sensor with the greatest possible detection range and to achieve the highest possible sensitivity of the sensor.

According to the invention a foil of soft magnetic material is used whose permeability change has an effect on a sensor coil.

The change in permeability produces a detectable feedback on the coil, which shows up generally by a change in impedance of the coil. The impedance or impedance change of the coil can be measured in the usual manner by the action of an alternating current on the sensor coil.

However, it is emphasized that the permeability change can also be recorded with other inductive or magnetic field-sensitive measurement elements.

In the context of an advantageous embodiment a compensation coil excited with direct current is arranged in the vicinity of the soft magnetic foil next to the sensor coil acted upon by direct current. Because of this, depending on the design and arrangement of the coil, the permeability can be influenced in a more or less large area of the foil. This can be utilized in order to deliberately create particularly favorable conditions for detection of a measured object. If the measured object is situated at a relatively large distance, the magnetic field of a magnet assigned to the measured object will only have a slight effect on the foil, since the sensitivity of the sensor arrangement is situated in an unfavorable area. By acting upon the compensation coil with a direct current a shift in the sensitivity characteristic can be achieved and the sensitivity in a specific part of the measurement range deliberately increased. On the other hand, the field intensity might already have assumed unduly high values if, for example, the measured object is situated very close to the sensor. The field intensity can then be deliberately reduced by the compensation coil so that the sensor arrangement is again situated in a more favorable operating state. In this way, depending on the polarity and intensity of the direct current the measurement range can be significantly expanded and the sensitivity over the measurement range improved. In addition, installation tolerances or slowly varying disturbances, like temperature drift or aging, can be compensated or corrected by adjusting the magnetic field of the compensation coil.

Both embodiments can also be implemented simultaneously so that the positive effects of both embodiments are added to each other.

In the embodiment with a dc-excited compensation coil the direct current is advantageously adjustable. This can pertain to merely the intensity of the direct current, on the one hand, or its polarity could also be changed. By adjusting the intensity of the direct current the degree of influencing of the permeability of the soft magnetic foil can be changed. A change in polarity means that the resulting magnetic field, which is produced from the magnetic fields of the sensor coil, the compensation coil and the magnet of the measured object, is increased or reduced. Because of this a particularly extensive effect can be produced on the magnetic field that influences the permeability of the foil. The direct currents could then be adjusted so that an essentially constant magnetic field of the sensor coil is set.

Advantageously, the sensor is subjected to calibration, especially before first startup. For this purpose the following steps are preferably conducted. In a first step the measured object is positioned at a number of positions h relative to the sensor. The individual positions h have a step width δh. The individual positions are preferably arranged so that they are essentially situated on a common line.

An alternating current is fed to the sensor coil at each of the positions h. Because of this the sensor coil generates an electromagnetic alternating field, which is influenced by the soft magnetic foil. For each of the positions h the impedance Z and/or the relative impedance change ΔZ/Z of the coil is determined. Different methods from practice are known for this purpose. A characteristic is determined from the values so obtained, which describes a dependence between the relative sensitivity S of the sensor coil and the position h of the measured object relative to the sensor coil. The relative sensitivity S is then given by $$S = \frac{\Delta Z/Z}{\delta h}.$$

A position $h_0$ is determined from this characteristic, at which the relative sensitivity S assumes a maximum value.

The value $Z_0$ of the complex impedance corresponding to this position $h_0$ is stored in a nonvolatile memory. The characteristic of the sensor was therefore determined with these steps.

In the next steps the dependence of the measurement results on the intensity of the direct current is determined. For this purpose a direct current is fed into the compensation coil. The measured object is again placed at different positions h and the impedance Z and/or relative impedance change $\Delta Z/Z$ of the coil determined at each position h. The superposition of magnetic fields of the sensor coil, compensation coil and magnet of the measured object then act on the foil. In a next step the intensity of the direct current is varied in the measurement range $\pm\Delta h$. This is repeated until a predetermined and stored target value of the impedance is reached. The dependence of the direct current on the position change of the measured object is determined from the values so obtained. It is then found that an essentially linear relation is obtained between the position h and the direct current by the compensation coil in the measurement range $\pm\Delta h$. In many applications it can therefore be sufficient to merely determine and store the proportionality factor between the position change and the direct current.

It is advantageous if the predetermined target value of the complex impedance is determined at a base distance between the measured object and the sensor, at which the position changes of the measured object lead to maximum impedance changes of the coil system.

Generally, to determine the feedback of the change in permeability of the foil on the coil its impedance change is measured. However it is mentioned that measurement of permeability, in principle, could also be carried out in another way. Measurement of impedance can occur directly or indirectly. For example, when a known current is impressed, the voltage drop over the coil can be measured and the impedance determined by dividing the voltage by the current. However, the impedance could also be widened by a parallel-connected capacitance to a freely oscillating oscillator, which is driven, for example, via a PLL (phase locked loop) circuit. A conclusion concerning the impedance of the sensor coil can be drawn from the initial signal of the PLL circuit.

The real part $Re\{Z\}$ and the imaginary part $Im\{Z\}$ can be determined from the complex impedance Z of the sensor coil. Determination of the real and imaginary part can occur in analog or digital fashion. Corresponding methods are adequately known from practice. The ratio D from the real part $Re\{Z\}$ and the imaginary part $Im\{Z\}$ could also be formed, in which the following applies for ratio D:

$$D=Re\{Z\}/Im\{Z\}.$$

According to a preferred variant of the invention, the magnitude of the direct current is set by the compensation coil in a servo control by means of a closed control loop. The ratio D can serve as target value for the control circuit in which D could be kept constant. The position or position change of the measured object relative to the sensor could be determined for the imaginary part $Im\{Z\}$. In addition or as an alternative, the intensity of the direct current could be used for position determination by the compensation coil.

Control preferably occurs so that a maximum relative sensitivity S of the sensor is kept constant over the entire measurement range or at least part of it. For this purpose the information obtained from a calibration could be used. Maximum sensitivity is present at the position $h_0$, which can be displaced by the compensation coil by choosing a direct current.

As an alternative to control the direct current could be manually adjusted. In particular, during movements of the measured object with high dynamics, the control might not react quickly enough to changes. Manual adjustment of the direct current can be accomplished in a variety of ways. Thus, the intensity of the direct current could be entered, for example, via keys or a keyboard. As an alternative or in addition, analog or digital rotation or shift controls could be used.

In the sensor arrangement that has a dc-excited compensation coil, the magnetic fields of the sensor coil, the compensation coil and the magnet of the measured object overlap to a resulting magnetic field. The directions and polarity of the individual magnetic fields are then generally different. The magnetic field of the sensor coil is an alternating field because of supply with alternating current and therefore changes its polarity with twice the frequency of the alternating current. The magnetic field of the compensation coil, depending on the position of the measured object relative to the sensor is adjusted via a control or manually. The polarity of the direct current exciting the compensation coil can then be chosen so that the static field component of the magnetic field is increased or reduced. This is dependent on the direction in which the resulting magnetic field is to be displaced in order to achieve the best possible or even ideal conditions for measurement of the positions. The magnetic field of the magnet assigned to the measured object will generally be a non-homogeneous magnetic field and will depend on the distance between the sensor and the measured object.

The sensor coil and the compensation coil could be galvanically separated from each other. Because of this the two coils are acted upon with currents completely independently of each other. However, it should be pointed out that the two coils could also be combined into a single coil or one of the two coils could be designed as a partial section of the other coil by an intermediate tap. In the embodiment with an individual coil an alternating current displaced by a dc part would be fed into the coil. The offset could also be adjusted by means of a control circuit or manually in a galvanically separated configuration of the two coils.

The magnet of the measured object is preferably a permanent magnet. Because of this the measured object can be used independently of any additional power supply. However, the magnet could also be formed by an electromagnet. Because of this an effect can be had on the measurement. If the measured object, for example, is situated comparatively close to the sensor, by reducing the exciter current the magnetic field of the magnet could be reduced. At large spacing between the measured object and the sensor the exciter current could also be increased. Both embodiments of the magnet could also be used combined.

In one possible embodiment of the evaluation circuit for the sensor the foil is coupled capacitively to the sensor coil. In this embodiment the foil has an electrical contact connected to an oscillator. The other pole of the oscillator is connected to one of the terminals of the sensor coil. In this way the energy is capacitively coupled into the sensor coil. The two terminals of the sensor coil are connected to the inputs of an amplifier, which amplifies the voltage drop over the sensor coil. The amplifier is then part of the evaluation circuit by means of which the change in permeability of the foil is determined. The voltage drop over the coil is amplified by the amplifier and supplied as amplified signal $U_2$. This signal $U_2$ is proportional to the relative impedance change $\Delta Z/Z$.

As an alternative to this embodiment the oscillator could be directly connected to the sensor coil. The alternating current would therefore be directly coupled into the coil. The foil could then be connected, for example, to ground. In this embodiment the voltage drop over the sensor coil would also be amplified and a signal $U_2$ proportional to the relative impedance change $\Delta Z/Z$ would be produced.

In both cases an electronic arrangement could be provided which forms two orthogonal voltage components from the voltage signal $U_2$. The two components are then proportional to the real part $Re\{Z\}$ and the imaginary part $Im\{Z\}$ of the complex impedance $Z$ of the sensor coil. The electronic arrangement would produce voltage signals $U_3$ and $U_4$, which represent the two orthogonal voltage components. The signal $U_4$ could be used for synchronization of the oscillator, whereas the signal $U_3$ is used to control the voltage source that supplies the compensation coil with a direct current.

The electronic arrangement can be implemented by a variety of arrangements known from practice. Analysis of the amplified signal preferably occurs digitally. The electronic arrangement would then have an A/D converter, a processor and a memory. For galvanic separation of the electronic arrangement from the power supply, an optocoupler could additionally be provided, via which the control information is transmitted to the power supply galvanically decoupled.

In the embodiment of the sensor arrangement without compensation coil and with restricted movement direction of the measured object in directions that are essentially parallel to a direction of expansion of the foil, the magnet could also be implemented by a permanent magnet or an electromagnet. In an embodiment with an electromagnet the measurement behavior of the sensor (as already described above) could again be affected.

Calibration of the sensor arrangement can also be carried out in this type of configuration. For this purpose the already described steps for determination of the sensor characteristic would be conducted accordingly.

The embodiment of the evaluation circuit would occur in comparable fashion as in the embodiment with the compensation coil. An oscillator could supply a voltage signal directly to a contact of the foil. The voltage could then be coupled into the sensor coil capacitively. The voltage developing on the coil could again be amplified via an amplifier and fed to an electronic arrangement to determine the real and imaginary part. A synchronization of the oscillator could be produced from a voltage signal $U_4$ proportional to the imaginary part.

The oscillator could also be directly connected to the sensor coil and the voltage drop developing over the coil amplified by an amplifier. The amplified signal could then be fed to an electronic arrangement in order to extract the real and imaginary part from the amplified signal.

In both embodiments of the sensor arrangement according to the invention (i.e., the sensor arrangement with or without compensation coil) the sensor could be formed in different ways. The sensor could be applied to a round or other three-dimensionally embossed support. The sensor coil, the foil and optionally the compensation coil could be wound onto the support, glued or applied in some other way.

In an alternative embodiment the sensor could be designed flat. The sensor is then preferably applied to a flat support. However, the sensor could also be curved and adapted to special work surroundings. Such sensors could be used without problem after corresponding calibration measures.

For a further improvement of sensitivity of the sensor arrangement the thickness of a foil could be adapted to the penetration depth of the electromagnetic field produced by the sensor coil. The electromagnetic field produced by the sensor coil is then preferably a high frequency one. The following applies for the penetration depth $\delta$ into a conducting material:

$$\delta \propto \frac{1}{\sqrt{\omega\sigma\mu}}$$

in which $\omega=2\pi f$ with f as frequency of the alternating field and $\sigma$ the conductivity and $\mu$ the permeability of the foil. As is apparent, $\delta$ is inversely proportional to the square root of the permeability $\mu$ of the foil. If the permeability of the foil drops because of the external magnetic field, the penetration depth of the electromagnetic field into the foil increases. If the thickness of the foil is appropriately dimensioned, the electromagnetic field penetrates through the foil in areas with lower permeability. This effect can also be used to increase sensitivity. A conducting surface could be arranged on the side facing away from the sensor coil next to the foil. This conducting surface preferably has a much higher conductivity in comparison with the soft magnetic foil. Because of this eddy currents would be induced to a higher degree in the conducting surface than in the soft magnetic foil.

Especially on restricting the movement of the measured object in directions essentially parallel to the direction of expansion of the foil, a situation is achieved in which the soft magnetic foil exposes the conducting surface lying behind it as a function of position of the measured object. Depending on the position of the measured object a zone of different width with reduced permeability would leave the soft magnetic foil permeable for the electromagnetic field of the sensor coil. (This can apparently be imagined in that the foil exposes a part of the window opening of different size in similar fashion to a jalousie.) Because of this, depending on the position of the measured object, eddy currents will be induced to different degrees in the conducting surface. This causes a stronger effect on impedance of the sensor coil than the eddy currents induced in the soft magnetic foil, which again has a positive effect on the sensitivity of the sensor arrangement.

The sensor coil is advantageously supplied with an alternating current with high frequency. The dynamics of the sensor is therefore very high. Because of the high frequency the penetration depth of the eddy currents into the conducting materials is low, which, however, is sufficient for thin foils (for example, 20 µm). It is apparent that a volume effect is not necessary or even desired: in a bulky soft magnetic material the eddy current would also only flow in a thin layer so that the measurement effect is limited relative to volume.

As described previously, the zone of the permeability change is dependent on the magnetic field strength. Depending on the magnet, the sensor can measure its position at relatively great distance (for example, 30-50 mm) with very high resolution (a few µm) by positioning the zone of highest sensitivity through an appropriate arrangement so that the working point lies at the stipulated base distance of the magnet relative to the sensor. In an appropriate embodiment of the magnetic circuit a so-called redundancy factor typically on the order of 3 is attainable. This means that the path of movement of the measured object is greater by a factor of 3 than the change in distribution permeability in the foil. The length of the foil is therefore shortened relative to the movement path by the redundancy factor. This is particularly advantageous because a short and compact design of such sensors is made possible on this account.

The embodiments of the sensors just described can also be implemented in that the foil and magnet are fixed and only the coil is moved.

In another advantageous embodiment the magnet can be connected fixed to the sensor. In order to obtain at the location of the sensor coil a magnetic field variable from the position of the measured object, the measured object must consist of a material that influences magnetic fields. This can be a ferromagnetic material. By a position change in the ferromagnetic measured object relative to the sensor and the magnet connected to the sensor, the magnetic field lines are influenced and a change in distribution of permeability in the foil is also produced.

BRIEF DESCRIPTION OF THE SEVERAL VIEWS OF THE DRAWINGS

There are now different possibilities for advantageously configuring and modifying the teachings of the present invention. On the one hand, the claims subordinate to claims 1, 13 and 25 and, on the other hand, the following explanation of preferred practical examples of the invention with reference to the drawing are referred to for this purpose. In conjunction with the explanation of preferred practical examples of the invention with reference to the drawing preferred embodiments and modifications of the teachings are also generally explained. In the drawing

DETAILED DESCRIPTION

The same reference numbers are used in the individual figures for the same or equivalent components.

Figure 1:
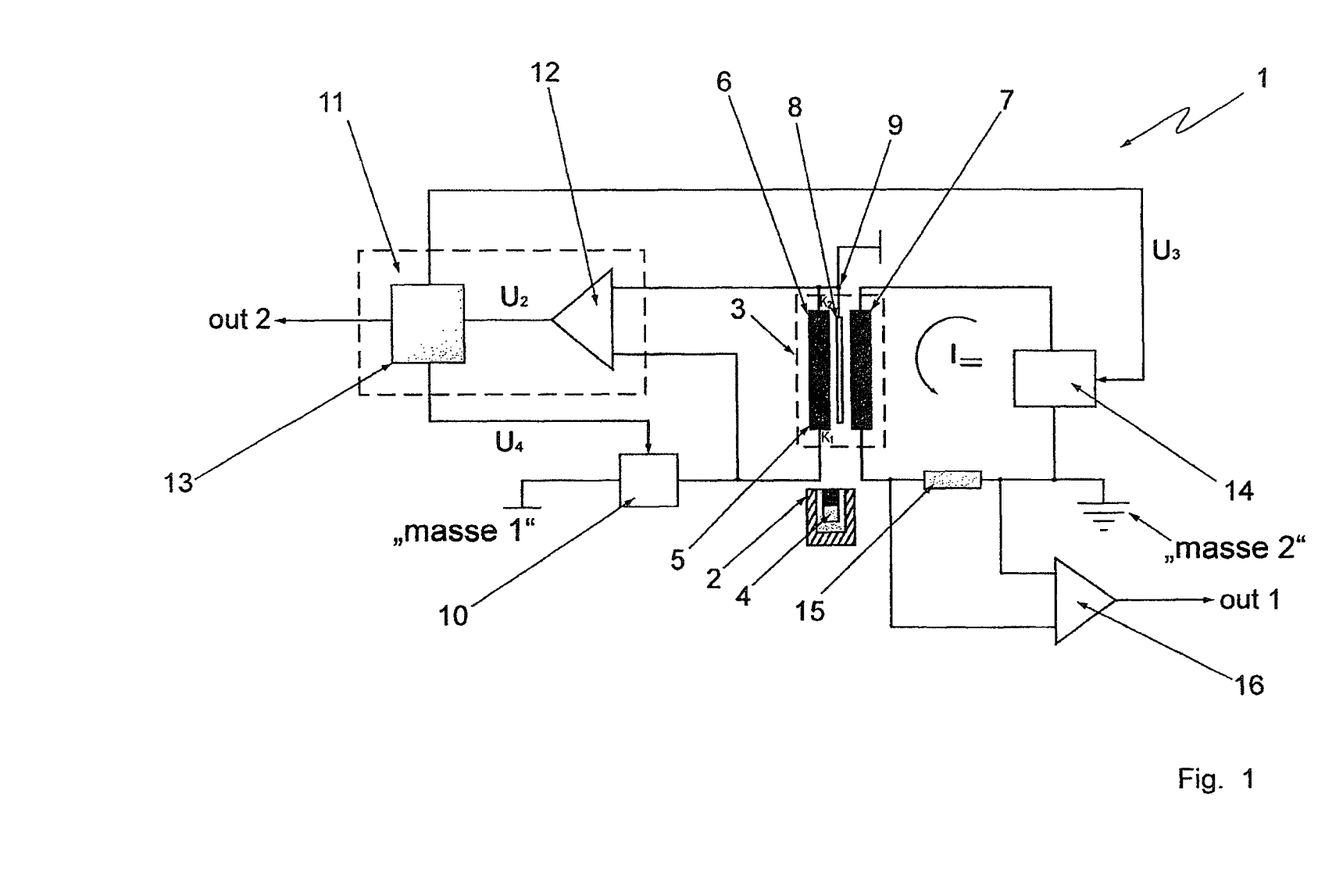
FIG. 1 shows in a schematic view a device according to the invention for recording the position and/or position changes of a measured object.

FIG. 1 shows in a schematic view a block diagram of a sensor arrangement 1 according to the invention to record the position h and/or position change of a measured object 2 relative to an electromagnetic sensor 3. A magnet 4 in the form of a permanent magnet is assigned to the measured object 2, which is enclosed on almost all sides in the depicted variant by the measured object 2. Sensor 3 has a coil system 5, which consists of a sensor coil 6 and a compensation coil 7. In the area of influence of the coil system 5 a foil 8 of soft magnetic material is arranged. The sensor coil 6 has two terminals $K_1$ and $K_2$. Terminal $K_1$ is connected to the synchronizable oscillator 10, terminal $K_2$ is connected to the input of an evaluation circuit 11 and the electrical contact 9 of the foil. The oscillator 10 supplies the sensor coil 6 with an alternating voltage of fixed frequency and amplitude. In this way an electromagnetic alternating field is generated by the sensor coil 6, which induces eddy currents in foil 8. The electromagnetic properties, like electrical conductivity σ and magnetic permeability μ of the material of foil 8, then influence the character and feedback of the eddy currents on the alternating field. Through a distance change between measured object 2 with sensor 3 the magnetic permeability μ of foil 8 changes, which leads to a change in alternating field in the coil system 5. As a result of this, the complex impedance Z of the sensor coil 6 changes, which is measured by means of evaluation circuit 11. The voltage drop between terminals $K_1$ and $K_2$ is amplified with a difference amplifier 12, in which the voltage $U_2$ at the output of the amplifier 12 is proportional to the impedance Z of the sensor coil 6. Two orthogonal components $U_3$ and $U_4$ are determined for voltage $U_2$ by an electronic arrangement 13.

The voltage $U_3$ is used to control a controllable voltage source 14, which supplies the compensation coil 7 of the coil system 5 with a direct current I_. Because of this a constant magnetic field is produced by the compensation coil 7, which together with the magnetic field of permanent magnet 4 and the alternative field of sensor coil 6 forms a resulting magnetic field. The size of the direct current I_ is measured via the voltage drop on a stable resistor 15 by means of an integrator 16. The signal at the output "out1" of integrator 16 is used to determine the distance changes between the measured object 2 and sensor 3.

Figure 8:
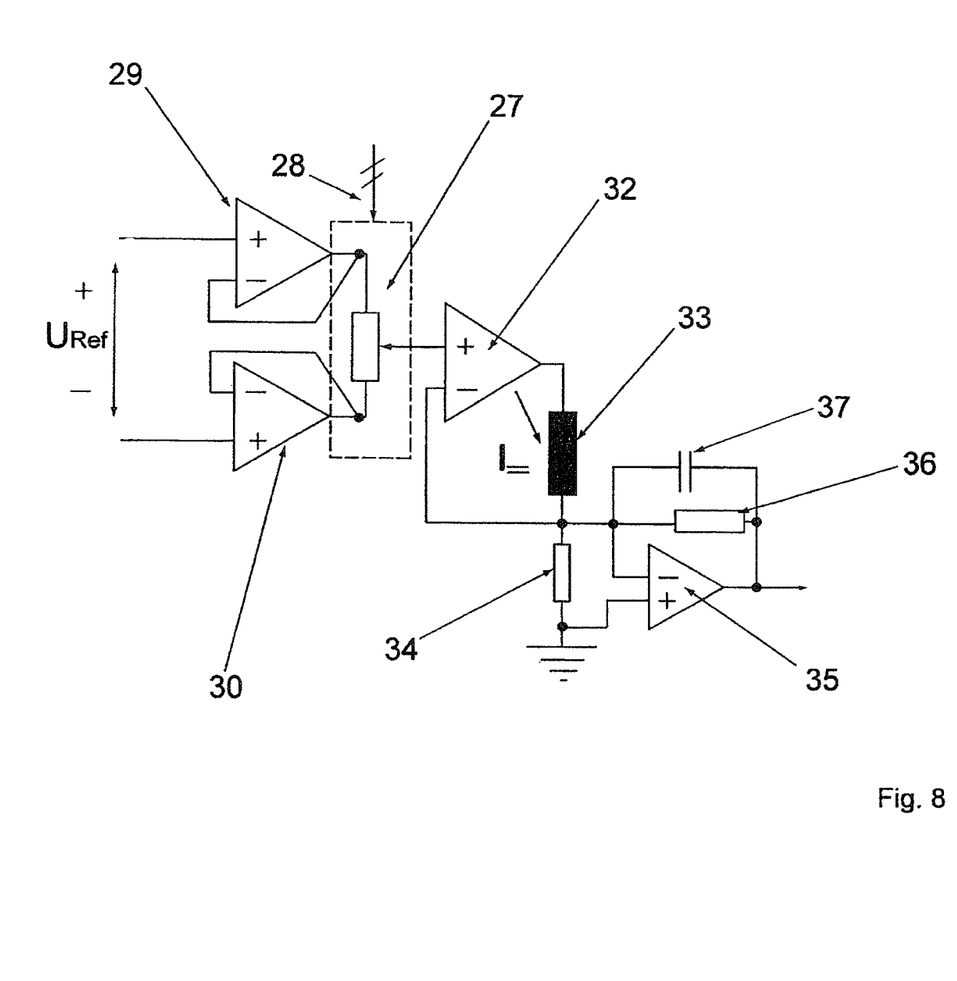

The controllable voltage source 14 can be formed in different ways. A D/A converter or digital potentiometer can be used, which are driven via the signal $U_3$. One possible embodiment is shown in FIG. 8 and described in detail further below.

The second voltage component $U_4$, which is generated by the electronic arrangement from voltage $U_2$, is used to synchronize oscillator 10. Because of this the voltage $U_1$ and voltage $U_4$ produced by the oscillator are synchronous.

The sensor arrangement 1 could be used in a closed control loop, in which the signal $U_3$ is a control quantity determined as the difference between a target value in the memory of electronic arrangement 13 and the voltage $U_2$. In another variant of the control loop the signal $U_3$ is interrupted and the voltage source 14 controlled manually, for example, via the keyboard, in order to reach a certain value of direct current I_. The output signal is generated from "out2" of the electronic arrangement 13.

The relation between magnetic field distribution along the foil 8 and position h of magnet 4 will be explained with reference to FIGS. 2(A), (B), (C). The foil 8 consists of a nanocrystalline material that is applied to a support 17, which consists of ceramic, for example. In this FIG. 2 the significance of the redundancy factor is apparent: during a change in position of the measured object from distance $h_1$ to $h_4$ the distribution of permeability in the foil only varies by the path from a-b to g-h. This path is shortened by the redundancy factor relative to the path h covered by the measured object, in which the redundancy factor has a value of 3, for example.

Figure 2:
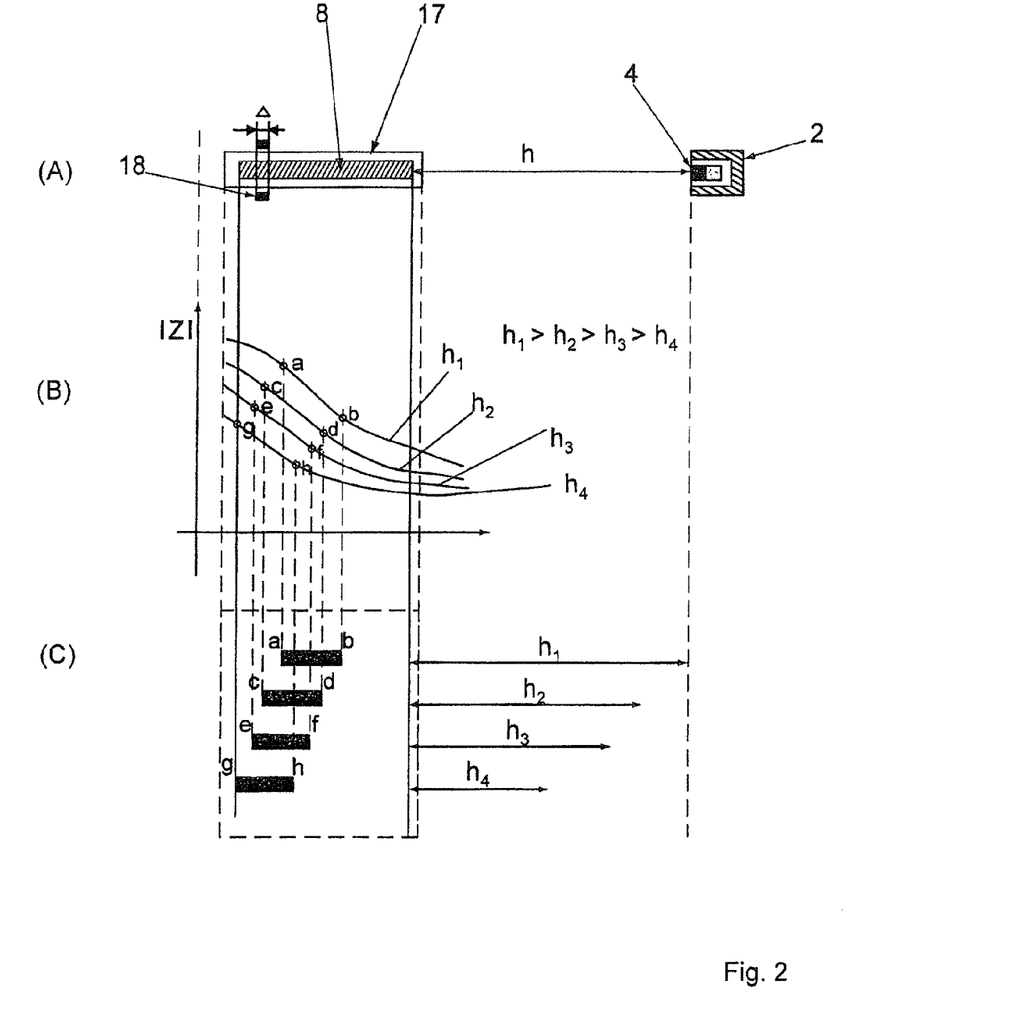
FIG. 2 shows a diagram of the relation between a magnetic field distribution along soft magnetic foil and position h of the measured object.

FIG. 2(A) shows an arrangement consisting of a foil 8 applied to a support 17 and with which the distribution of the magnetic field generated by a permanent magnet 4 can be determined indirectly along foil 8. A measurement coil 18 with a width Δ=3 mm is arranged in one layer around the support 17 and foil 8. The measurement coil 18 is then configured so that it is movable in the longitudinal direction of foil 8.

The diagram depicted in FIG. 2(B) shows the amount of complex impedance of measurement coil 18 during a shift in measurement coil 18 in the x direction along foil 8 (length of the foil L=25 mm, width 5 mm and thickness 0.02 mm). Several impedance trends are shown in the diagram, which are obtained at different positions h of the measured object 2 relative to foil 8. For clarification the positions $h_1$=60 mm, $h_2=50$ mm, $h_3=40$ mm and $h_4=30$ mm are given as numerical values This also shows how large the measurement range of such an arrangement can be set.

The diagram of FIG. 2(C) schematically shows the area of the foil in which a maximum steepness of the impedance characteristic and therefore maximum sensitivity of the sensor using the soft magnetic foil is set. The areas are then shown for positions $h_1=60$ mm, $h_2=50$ mm, $h_3=40$ mm and $h_4=30$ mm. It is readily apparent that the areas (a-b), (c-d), (e-f) and (g-h) move in proportion to position h of the permanent magnet 4.

Figure 3:
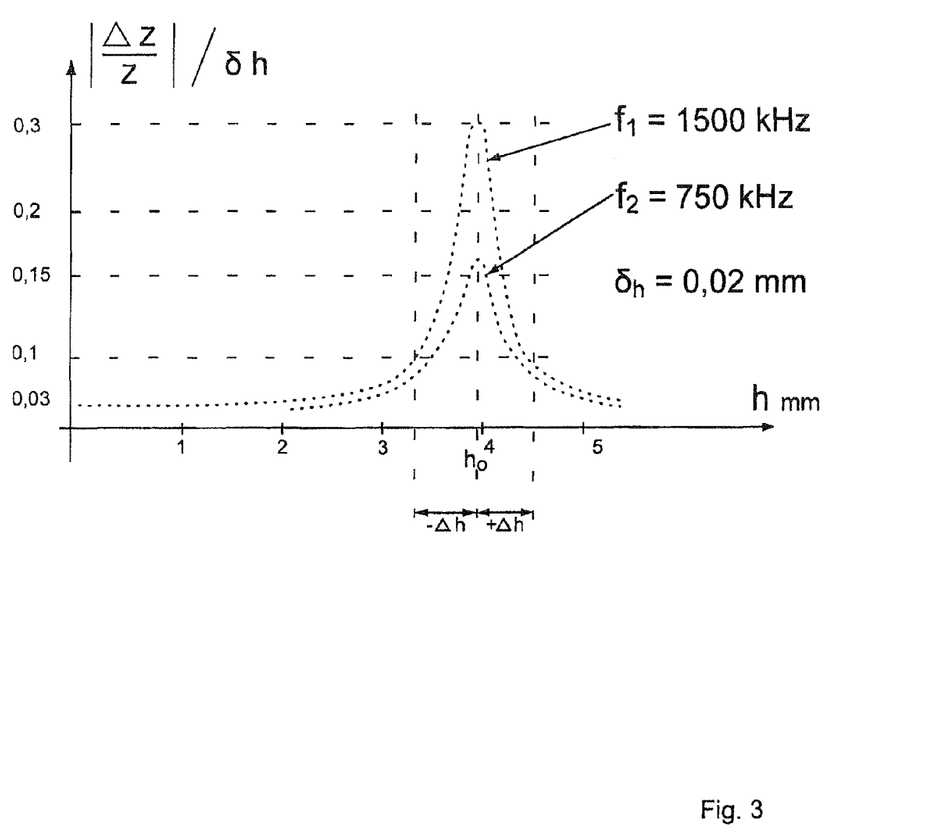
FIG. 3 shows a diagram with a typical trend of the relative sensitivity S as a function of position h of the measured object relative to the sensor.

The relative sensitivity S is plotted more precisely in FIG. 3 as a function of position h of the measured object 2. The following applies for sensitivity S of sensor 3:

$$S = \frac{\Delta Z/Z}{\delta h}$$

in which $\Delta Z/Z$ is the relative impedance change of the sensor coil (7) and $\delta h$ the step width between the individual positions h. It is readily apparent that the relative sensitivity S assumes maximum values at position $h_0$. In an area $\pm \Delta h$ around position $h_0$ the relative sensitivity S still remains at significant values and is then significantly reduced.

Figure 4:
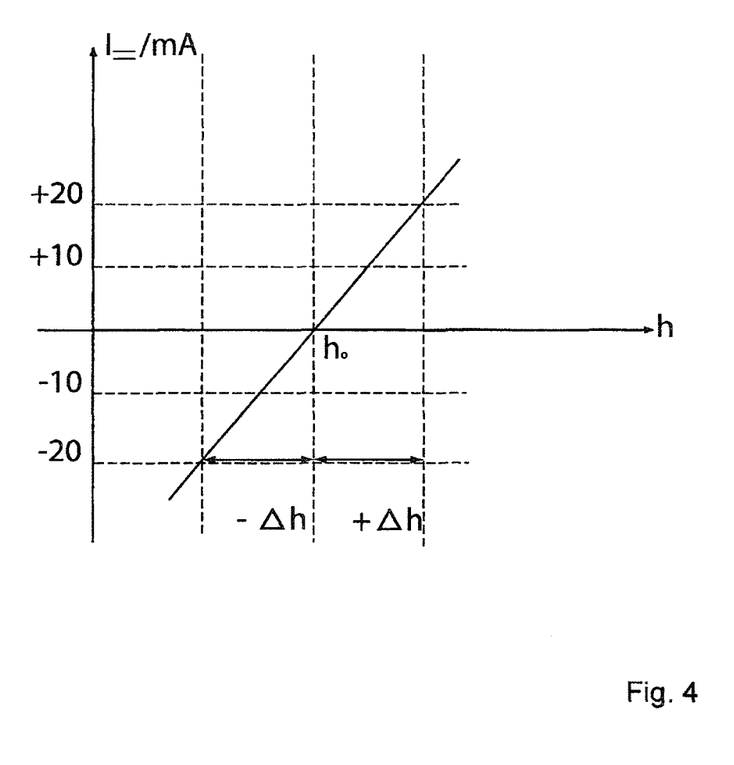
FIG. 4 shows a diagram with the trend of the direct current I_ as a function of position h of a measured object.

FIG. 4 shows a diagram of the direct current trends dependent on the position change $\pm \Delta h$ of a measured object relative to base position $h_0$. The diagram shows that a linear function can be set up between the direct current $I_-$ and the position changes of the permanent magnet $\pm \Delta h$.

Figure 5:
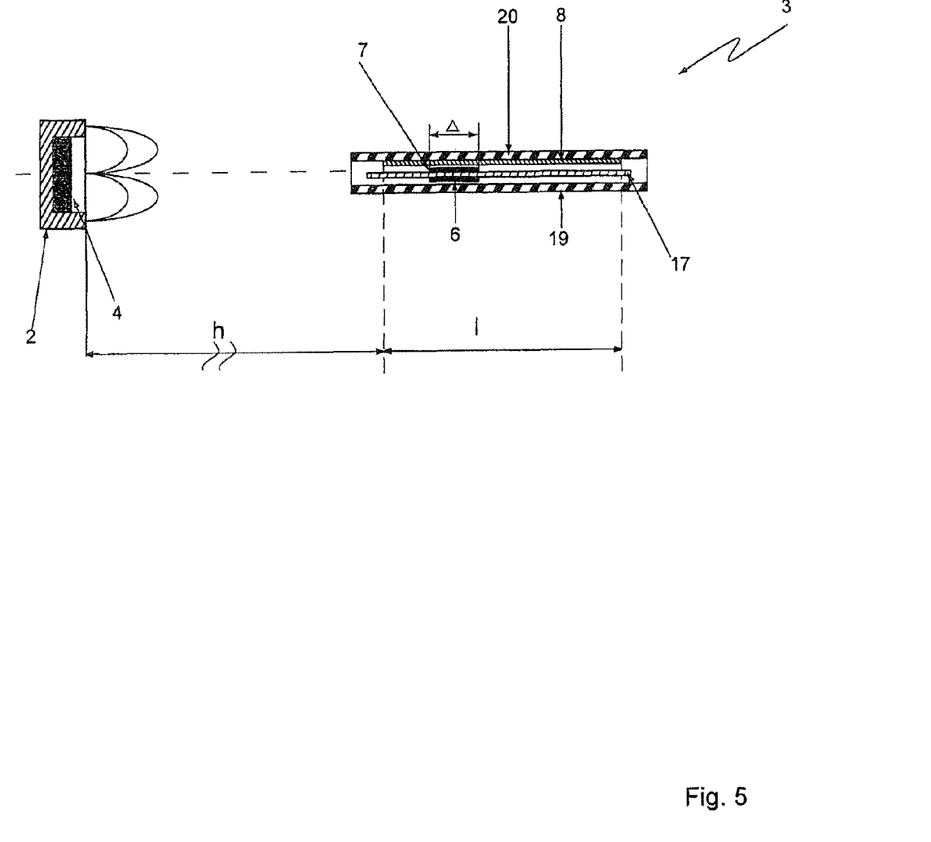
FIG. 5 shows a first practical example of a sensor arrangement according to the invention with a compensation coil.

FIG. 5 shows a first practical example of sensor arrangement according to the invention which consists of a measured object 2 and a sensor 3.

A permanent magnet 4 is incorporated in a housing of the measured object 2 so that the magnetic field direction agrees with the movement axis of the measured object 2. The sensor 3 is designed flat and contains a support 17 on which two planar coils 6 and 7 are arranged on both sides.

A circuit board or ceramic substrate could be used to support 17 and the coils 6 and 7 could be favorably produced by known methods, for example, screen printing on support 17 or gluing onto it.

The support 17 with coils 6 and 7 is covered with two circuit boards 19, 20 made of electrically conducting material, preferably aluminum or copper. The width "Δ" of coils 6 and 7 is only about 25% of the length "l" of foil 8, which is glued onto one side of circuit board 20. The coil 6 is supplied at high frequency alternating voltage and serves as measurement coil. The compensation coil 7 consists of several layers and is supplied with direct current.

Figure 6:
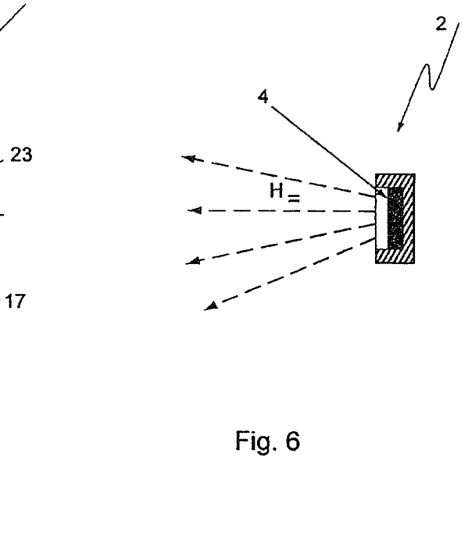
FIG. 6 shows a second practical example of a sensor arrangement according to the invention with a compensation coil.

FIG. 6 shows a second practical example of a sensor according to the invention. The sensor 3 consists of a round support 17 which is produced from a plastic. A first multilayer coil which serves as compensation coil 7 and is supplied with direct current is wound in a groove around support 17.

The measurement coil 6, which is supplied by an oscillator with alternating current of higher frequency, is wound in one layer along support 17 and encloses the compensation coil 7.

A foil 8 of nanocrystalline or amorphous material is glued in the interior of a tube 21. The tube 21 consists of a material with high electrical conductivity and simultaneously serves as sensor housing. The tube 21 is covered on a side of the measured object 2 with a cover 23 of electrically conducting material, which, however, is permeable for the permanent magnetic field (H=) of the measured object 2. The evaluation electronics 24 is incorporated in a housing 25 which should be connected to tube 21 and foil 8 for EMC reasons.

It is advantageous in this variant that the sensor 3 is completely encapsulated and shielded and can be incorporated directly without an additional pressure tube in a pressure space, for example, a hydraulic or pneumatic cylinder.

Figure 7:
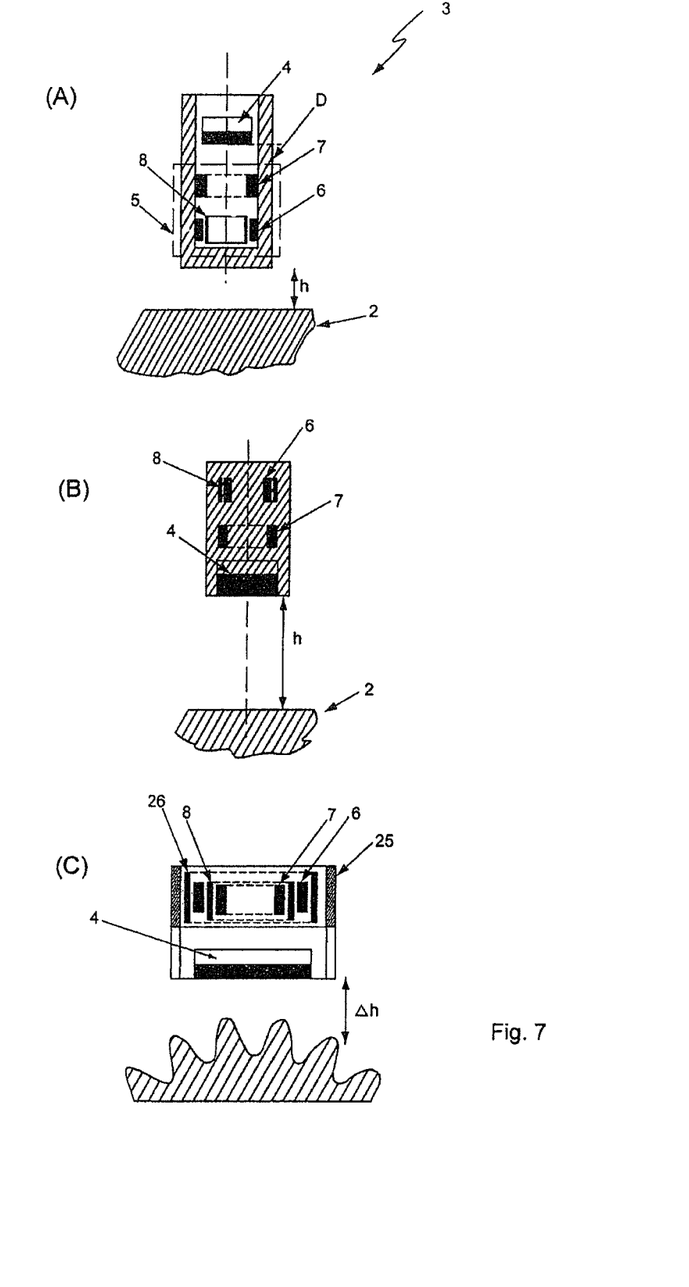
FIG. 7 shows a third practical example of a sensor arrangement according to the invention with a compensation coil and a permanent magnet permanently incorporated and FIG. 8 shows a circuit diagram of the control power supply to control the dc coil.

FIG. 7 shows a third variant of a sensor 3 in which a permanent magnet 4 is arranged at a specific fixed distance D to the coil system 5 of sensor 3 and does not move with the measured object 2.

The measured object 2 consists of ferromagnetic steel and is arranged at a base distance h to the surface of sensor 3 and is movable.

In a first variant (A) the permanent magnet 4 is arranged on the side of the coil system 5 facing away from measured object 2. This arrangement is particularly advantageous if relatively large measurement ranges, for example, 15 mm are measured with good linearity with a sensor 3 of limited size, for example, a diameter of 10 mm.

In a second variant (B) the permanent magnet 4 is arranged between the measured object 2 and the coil system 5. This variant can be used advantageously when small position changes $\Delta h$ are to be measured at relatively large base distance h of, say, 25-30 mm and the diameter of the sensor is only 10 mm.

In a third variant the coil system 5 of sensor 3, which consists of two coils 6 and 7, is wound concentrically on a support 17. A foil 8 of soft magnetic material is arranged between coil 6 and 7, which encloses coil 7. Coil 6 serves as a measurement coil whose impedance or the imaginary part Im Z of the impedance depends on distance h and is measured. The coil 7 is supplied with direct current and serves as compensation coil. A tube 26 made of an electrically conducting material, for example, aluminum or copper, is situated above it. The housing 25 could then be produced cost-effectively from a non-conducting material, for example, plastic. A direct current could be adjusted (or set) so that during position changes $\Delta h$ between sensor 3 and measured object 2 the impedance or Im Z remains constant. In this case the level of the direct current is proportional to the position changes $\Delta h$. The measured object could also have a profiled surface, for example, a gear or a rotor so that rotational speed and/or angles can also be measured with the sensor.

FIG. 8 shows a circuit diagram of the controllable dc source for driving the compensation coil with the device according to FIG. 1. The dc source has an electronically adjustable digital potentiometer 27 which is driven via a control line 28 by a tracking control or keyboard. The digital potentiometer 27 is supplied symmetrically with a direct voltage by two operational amplifiers 29, 30, in which a reference voltage $U_{Ref}$ lies between the non-inverting inputs of the operational amplifiers 29, 30. The potentiometer arm 31 of the digital potentiometer 27 is connected to the non-inverting input of an additional operational amplifier 32. A coil 33 is arranged between the output of the operational amplifier 32 and its inverting input, over which a direct current $I_-$ flows. The coil 33 is formed here by the compensation coil 7 of the circuit according to FIG. 1. The level of the direct current $I_-$ is determined by a resistor 34 as a function of the voltage of the output of the operational amplifier 32, which again depends on the position of the potentiometer arm 31 of the digital potentiometer. The circuit is then dimensioned so that in the middle position of potentiometer arm 31 the current $I_-$ equals zero. Depending on the position of the potentiometer arm, a positive or negative current can be produced. Depending on the position of the working point of the sensor the polarity and level of the direct current I_ is set so that the constant sensitivity of the sensor is reached in the area ±Δh.

The voltage dropping over resistor 34 is measured via an integrator, which consists of an operational amplifier 35, resistor 36 and capacitor 37.

Finally, it is mentioned that the practical examples described above merely explain the claimed teachings, but do not restrict them to the practical examples.

LIST OF REFERENCE NUMBERS

1 Sensor arrangement
2 Measured object
3 Sensor
4 Magnet
5 Coil system
6 Sensor coil
7 Compensation coil
8 Foil
9 Electrical contact (foil)
10 Oscillator
11 Evaluation circuit
12 Amplifier
13 Electronic arrangement
14 Voltage source
15 (Measurement) resistor
16 Integrator
17 Support
18 Measurement coil
19 Support (round)
20 Tube
21 Electrical contact (tube)
22 Housing
23 Evaluation circuit
24 Support (flat)
25 Shield
26 Conducting surface
27 Digital potentiometer
28 Control line
29 Operational amplifier
30 Operational amplifier
31 Potentiometer arm (potentiometer)
32 Operational amplifier
33 Coil
34 Resistor
35 Operational amplifier
36 Resistor
37 Capacitor

The invention claimed is:

1. A method for determination of the position or position change of a measured object relative to a sensor, said method comprising:
   providing a sensor having a sensor coil acted upon with alternating current,
   wherein a change in permeability of a foil is produced by a magnet assigned to the measured object in a soft magnetic foil whose permeability changes under the influence of a magnetic field as a function of the field intensity of the magnetic field and which is arranged in an area of influence of the sensor and wherein the change in permeability of the foil is determined from a feedback on the sensor and from it the position or position change of measured object relative to the sensor, and
   wherein a magnetic field is generated by a compensation coil excited with direct current, by means of which the permeability of the foil or parts of the foil is influenced.

2. The method according to claim 1, in which
   the direct current can be adjusted so that an essentially constant magnetic field of the sensor coil is established.

3. The method according to claim 1, further comprising calibrating the sensor, wherein the following steps are conducted to calibrate the sensor:
   positioning of the measured object at a number of positions h relative to the sensor with a step width δh,
   supplying an alternating current to the sensor coil,
   determining the impedance Z or relative impedance change ΔZ/Z of the sensor coil at each of the positions,
   determining a characteristic that describes a dependence of relative sensitivity S of the sensor coil on position h of the measured object, in which $$S = \frac{\Delta Z/Z}{\delta h}$$

determining position $h_0$ in the characteristic at which the relative sensitivity S assumes maximum values,
storing the value of complex impedance $Z_0$, which corresponds to position $h_0$, in a nonvolatile memory,
supplying direct current to the compensation coil,
determining impedance Z or relative impedance change ΔZ/Z of the sensor coil at each position h, in which the magnetic fields of the sensor coil, the compensation coil and the magnet act on the foil,
changing the direct current in measurement range ±Δh until a stored target value of the impedance is reached, and
determining the dependence of the direct current on the position change of the measured object.

4. The method according to claim 1, wherein determination of the impedance or its change is carried out to detect the feedback on the sensor coil produced by the change in permeability of the foil, in which
   the real part Re{Z} and the imaginary part Im{Z} of the complex impedance of the sensor coil and the ratio D =Re{Z}/Im{Z} can be determined.

5. The method according to claim 4, wherein the magnitude of the direct current through the compensation coil is adjusted in a tracking control by a closed control circuit, in which
   the ratio D can be used as target value for the control circuit or in which
   the imaginary part Im{Z} can be used to determine the position change between the measured object and the sensor, in which D is preferably kept constant or in which
   the intensity of the direct current that flows through the compensation coil can be used for position determination.

6. The method according to claim 5, wherein a maximum relative sensitivity S of the sensor is kept constant over an entire measurement range or part of it by the control.

7. A sensor arrangement for determination of the position or position change of a measured object relative to a sensor, said sensor arrangement comprising:
   a magnet assigned to the measured object; and
   a sensor having a sensor coil acted upon with alternating current,
   wherein in an area of influence of the sensor, a foil of soft magnetic material is arranged, in which the permeability of the foil varies under the influence of a magnetic field as a function of the field intensity of the magnetic field and wherein an evaluation circuit is provided by means of which the change in permeability of the foil is determined from its feedback on the sensor and the conclusion concerning the position or position change of the measured object relative to the sensor is drawn, and wherein a compensation coil excited with direct current is provided with which the permeability of the foil or part of the foil is influenced.

8. The sensor arrangement according to claim 7, in which the magnetic fields of the sensor coil, the compensation coil and the magnet can overlap to a resulting magnetic field or in which the sensor coil can be galvanically separated from the compensation coil.

9. The sensor arrangement according to claim 7, wherein the direct current can be adjusted in its intensity or wherein the magnet includes a permanent magnet or an electromagnet or wherein the foil is capacitively coupled to the sensor coil and has an electrical contact, in which an oscillator can be connected between the contact of foil and a connection of the sensor coil.

10. The sensor arrangement according to claim 9, wherein a second connection of the sensor coil is connected to an input of amplifier of the evaluation circuit, in which a signal $U_2$ produced by the amplifier is proportional to a relative impedance change $\Delta Z/Z$ of the sensor coil, in which an electronic arrangement can be provided to determine two orthogonal components of voltage $U_2$, in which one of the two components is proportional to the real part $Re\{Z\}$ and the other is proportional to the imaginary part $Im\{Z\}$ of the complex impedance Z of the sensor coil.

11. The sensor arrangement according to claim 10, wherein the electronic arrangement contains an A/D converter, a processor and a memory and is connected to the input of the voltage source via an optocoupler.

12. The sensor arrangement according to claim 11, wherein a second connection of the sensor coil is connected to an amplifier of the evaluation circuit, in which a signal $U_2$ at the output of the amplifier is proportional to an impedance change $\Delta Z/Z$ of the sensor coil.

13. The sensor arrangement according to claim 9, wherein a second connection of the sensor coil is connected to an input of amplifier of the evaluation circuit, in which a signal $U_2$ produced by the amplifier is proportional to the relative impedance change $\Delta Z/Z$ of the sensor coil, in which the electronic arrangement produces signals $U_3$ and $U_4$, in which the oscillator can be synchronized by the signal $U_4$ and the signal $U_3$ can be used to control the voltage source.

14. The sensor arrangement according to claim 7, wherein the sensor is applied to a round support or wherein the sensor is configured flat and is applied to a preferably flat support or wherein because of the change in permeability of the foil, the penetration depth of the electromagnetic field generated by the sensor coil can be increased and wherein the foil is dimensioned in thickness so that the electromagnetic field can pass through the foil in the areas with low permeability or wherein a conducting surface is provided, which is arranged next to the foil and on a side facing away from sensor coil, in which the electromagnetic field passing through the foil can induce eddy currents in the conducting surface.

15. A sensor arrangement for determination of the position or position change of a measured object relative to a sensor, said sensor arrangement comprising:

a magnet assigned to the measured object; and a sensor having a sensor coil acted upon with alternating current, wherein a foil made of soft magnetic material is arranged in an area of influence of the sensor, in which the permeability of the foil varies under the influence of a magnetic field as a function of the field intensity of the magnetic field and in which movement of the measured object occurs essentially in directions parallel to an expansion direction of foil and wherein the change in permeability of foil is determined from the feedback on the sensor and from it the position or position change of the measured object relative to the sensor, and wherein a region of higher permeability is formed in the foil, a region of reduced permeability and a transitional region between the two regions, and wherein depending on the distance between the sensor and measured object, the transitional region is displaced along the foil.

16. The sensor arrangement according to claim 15, wherein an evaluation circuit is provided by means of which the change in permeability of the foil is determined from its feedback on the sensor coil, in which the magnet includes a permanent magnet or electromagnet or in which the foil can be capacitively coupled to the sensor coil and can have an electrical contact, in which an oscillator is connected between contact of the foil and a connection of the sensor coil.

17. A method for determination of the position or position change of a measured object relative to a sensor, said method comprising:

providing a sensor having a sensor coil acted upon with alternating current, wherein a change in permeability of a foil is produced by a magnet assigned to the measured object in a soft magnetic foil whose permeability changes under the influence of a magnetic field as a function of the field intensity of the magnetic field and which is arranged in an area of influence of the sensor and wherein the change in permeability of the foil is determined from a feedback on the sensor and from it the position or position change of measured object relative to the sensor, wherein movement of the measured object occurs essentially in directions parallel to an expansion direction of the foil, wherein a region of higher permeability is formed in the foil, a region of reduced permeability and a transitional region between the two regions, and wherein depending on the distance between the sensor and measured object, the transitional region is displaced along the foil.

* * * * *

UNITED STATES PATENT AND TRADEMARK OFFICE
CERTIFICATE OF CORRECTION

PATENT NO.       : 8,476,896 B2                                    Page 1 of 1
APPLICATION NO. : 12/519554
DATED            : July 2, 2013
INVENTOR(S)      : Vladislav Mednikov It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 987 days.

Signed and Sealed this
Eighth Day of September, 2015

Michelle K. Lee
*Director of the United States Patent and Trademark Office*